(12) United States Patent
Zhu et al.

(10) Patent No.: US 9,620,454 B2
(45) Date of Patent: Apr. 11, 2017

(54) MIDDLE-OF-LINE (MOL) MANUFACTURED INTEGRATED CIRCUITS (ICS) EMPLOYING LOCAL INTERCONNECTS OF METAL LINES USING AN ELONGATED VIA, AND RELATED METHODS

(71) Applicant: QUALCOMM Incorporated, San Diego, CA (US)

(72) Inventors: John Jianhong Zhu, San Diego, CA (US); Kern Rim, San Diego, CA (US); Stanley Seungchul Song, San Diego, CA (US); Jeffrey Junhao Xu, San Diego, CA (US); Da Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/484,366

(22) Filed: Sep. 12, 2014

(65) Prior Publication Data
US 2016/0079175 A1    Mar. 17, 2016

(51) Int. Cl.
*H01L 23/48*    (2006.01)
*H01L 23/52*    (2006.01)
(Continued)

(52) U.S. Cl.
CPC .... *H01L 23/53257* (2013.01); *H01L 21/0217* (2013.01); *H01L 21/76802* (2013.01);
(Continued)

(58) Field of Classification Search
CPC ............. H01L 23/5329; H01L 23/5226; H01L 23/5222; H01L 23/481; H01L 2924/01013;
(Continued)

(56) References Cited

U.S. PATENT DOCUMENTS 7,160,772 B2 *  1/2007  Coolbaugh ....... H01L 21/76808
                                                 257/E21.008
8,133,774 B2    3/2012  Botula et al.
(Continued)

FOREIGN PATENT DOCUMENTS

EP    1628349 A2    2/2006
EP    2581935 A2    4/2013

OTHER PUBLICATIONS

International Search Report and Written Opinion for PCT/US2015/046518, mailed Nov. 10, 2015, 12 pages.
(Continued)

*Primary Examiner* — Teresa M Arroyo
(74) *Attorney, Agent, or Firm* — Withrow & Terranova, PLLC

(57) ABSTRACT

Middle-of-line (MOL) manufactured integrated circuits (ICs) employing local interconnects of metal lines using an elongated via are disclosed. Related methods are also disclosed. In particular, different metal lines in a metal layer may need to be electrically interconnected during a MOL process for an IC. In this regard, to allow for metal lines to be interconnected without providing such interconnections above the metal lines that may be difficult to provide in a printing process for example, in an exemplary aspect, an elongated or expanded via(s) is provided in a MOL layer in an IC. The elongated via is provided in the MOL layer below the metal layer in the MOL layer and extended across two or more adjacent metal layers in the metal layer of the MOL layer. Moving the interconnections above the MOL layer can simplify the manufacturing of ICs, particularly at low nanometer (nm) node sizes.

18 Claims, 7 Drawing Sheets

(51) Int. Cl.
  *H01L 29/40*   (2006.01)
  *H01L 23/532*  (2006.01)
  *H01L 21/02*   (2006.01)
  *H01L 21/768*  (2006.01)
  *H01L 23/528*  (2006.01)
  *H01L 27/02*   (2006.01)
  *H01L 23/522*  (2006.01)

(52) U.S. Cl.
  CPC .. *H01L 21/76831* (2013.01); *H01L 21/76877* (2013.01); *H01L 21/76895* (2013.01); *H01L 23/522* (2013.01); *H01L 23/528* (2013.01); *H01L 23/5329* (2013.01); *H01L 27/0207* (2013.01); *H01L 23/5226* (2013.01); *H01L 2924/0002* (2013.01)

(58) Field of Classification Search
  CPC . H01L 2924/01029; H01L 2924/01078; H01L 2924/01079; H01L 21/0217; H01L 21/768; H01L 21/76802; H01L 21/76831; H01L 21/76877; H01L 23/522; H01L 23/528; H01L 23/53257; H01L 27/0207; H01L 2924/0002; H01L 2924/00; H01L 21/76895
  USPC .................. 257/758, 774, 770, 773; 438/618
  See application file for complete search history.

(56) References Cited

U.S. PATENT DOCUMENTS

| | | | |
|---|---|---|---|
| 8,383,510 B2 | 2/2013 | Heinrich et al. | |
| 8,421,128 B2* | 4/2013 | Abou-Khalil | H01L 21/743 257/280 |
| 8,421,186 B2 | 4/2013 | Li et al. | |
| 2007/0023758 A1* | 2/2007 | Tsurume | H01L 27/1266 257/66 |
| 2007/0218685 A1 | 9/2007 | Sivakumar et al. | |
| 2007/0296064 A1* | 12/2007 | Gates | H01L 21/31116 257/632 |
| 2008/0093743 A1* | 4/2008 | Yang | B81C 1/00095 257/758 |
| 2009/0152724 A1* | 6/2009 | Wang | H01L 23/5226 257/751 |
| 2010/0108970 A1* | 5/2010 | Liu | H01L 27/2409 257/2 |
| 2010/0109128 A1 | 5/2010 | West et al. | |
| 2010/0200992 A1* | 8/2010 | Purushothaman | H01L 21/6835 257/758 |
| 2013/0113068 A1 | 5/2013 | Ramachandran et al. | |
| 2013/0181330 A1 | 7/2013 | Ramachandran et al. | |
| 2013/0292836 A1 | 11/2013 | Tang et al. | |
| 2013/0307032 A1 | 11/2013 | Kamineni et al. | |
| 2014/0138750 A1 | 5/2014 | Wu et al. | |
| 2014/0162464 A1* | 6/2014 | Dimitrakopoulos | H01L 23/5329 438/761 |
| 2014/0191339 A1 | 7/2014 | Hong | |
| 2014/0191367 A1 | 7/2014 | Xiao et al. | |
| 2014/0203433 A1* | 7/2014 | Kinser | H01L 23/38 257/738 |
| 2015/0201495 A1* | 7/2015 | Kim | H05K 1/0306 174/255 |
| 2015/0325515 A1* | 11/2015 | Zhu | H01L 23/5228 257/758 |

OTHER PUBLICATIONS

Second Written Opinion for PCT/US2015/046518, mailed Oct. 6, 2016, 7 pages.
International Preliminary Report on Patentability for PCT/US2015/046518, mailed Jan. 9, 2017, 8 pages.

* cited by examiner

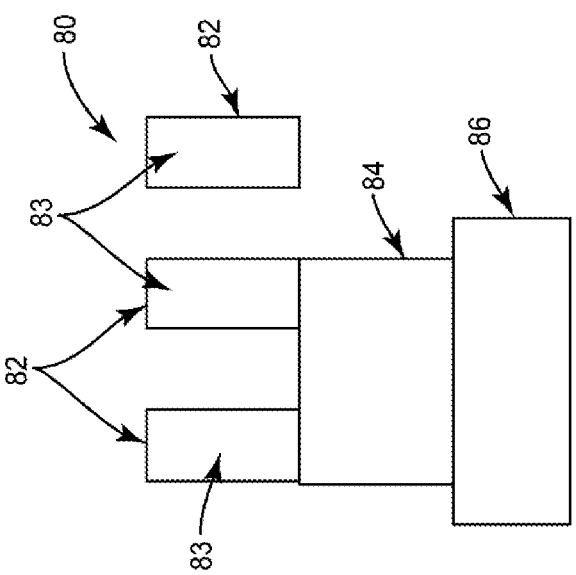
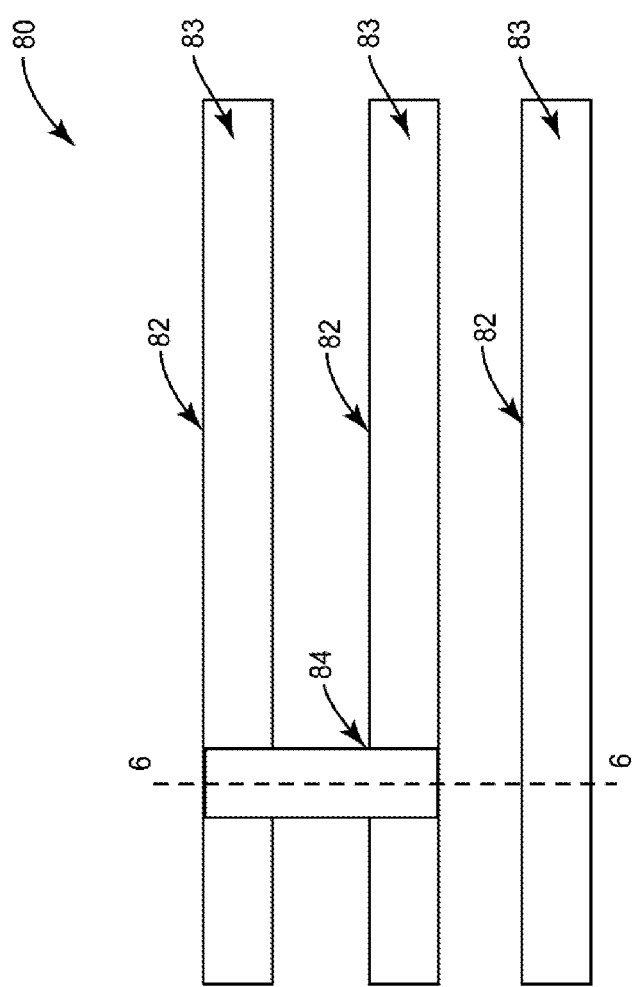
FIG. 6
FIG. 5

MIDDLE-OF-LINE (MOL) MANUFACTURED INTEGRATED CIRCUITS (ICS) EMPLOYING LOCAL INTERCONNECTS OF METAL LINES USING AN ELONGATED VIA, AND RELATED METHODS

BACKGROUND

I. Field of the Disclosure

The technology of the disclosure relates generally to middle-of-line (MOL) manufacturing processes for integrated circuits (ICs), and particularly to facilitating interconnections between metal lines in a metal layer.

II. Background

Computing devices have become commonplace throughout society. The increasing presence of such computing devices has accelerated in part because of the increasing functionality and versatility of such computing devices. This increase in functionality and versatility has been enabled by providing increasingly powerful processing capabilities in small packages, as loosely recognized by Moore's Law. The pressures to increase processing capabilities while decreasing the size of integrated circuits (ICs) has strained conventional manufacturing processes, especially as node size has been reduced to the low nanometer (nm) dimension (e.g., <20 nm).

Current semiconductor fabrication of ICs may include front-end-of-line (FEOL), middle-of-line (MOL), and back-end-of-line (BEOL) processes. The FEOL processes may include wafer preparation, isolation, well formation, gate patterning, spacer, extension, source/drain implantation, silicide formation, and the like. The MOL processes may include gate contact formation and interconnection between differing layers of an IC. The BEOL processes may include a series of wafer processing steps for interconnecting semiconductor devices created during the FEOL and MOL processes. Successful fabrication and qualification of modern semiconductor chip products involves an interplay between the materials and the processes employed. In particular, coupling metal lines in a metal layer in a MOL IC during the MOL processes is increasingly challenging at the current low nanometer (nm) node sizes, particularly for lithography printing. As MOL stacks are scaled down, the pitch of the metal lines is further reduced such that it may not be possible to provide interconnection vias in a layer above the metal lines for metal line interconnections due to the tight pitch.

SUMMARY OF THE DISCLOSURE

Aspects disclosed in the detailed description include middle-of-line (MOL) manufactured integrated circuits (ICs) employing local interconnects of metal lines using an elongated via. Related methods are also disclosed. In particular, different metal lines in a metal layer may need to be electrically interconnected during a MOL process for an IC. In this regard, to allow for metal lines to be interconnected without providing such interconnections above the metal lines that may be difficult to provide in a printing process for example, in an exemplary aspect, an elongated or expanded via(s) is provided in a MOL layer in an IC. The elongated via is provided in the MOL layer below the metal layer in the MOL layer and extended across two or more adjacent metal layers in the metal layer of the MOL layer. Since such metal lines are typically fabricated in a metal layer unidirectional and parallel to each other, having such electrical cross-coupling allows for greater design flexibility in routing connective elements in MOL layers in an IC. Moving the interconnections to the MOL layer (e.g., above a dielectric layer) can simplify the manufacturing of integrated circuits (ICs), particularly at low nanometer (nm) node sizes.

In this regard in one aspect, an IC is disclosed. The IC comprises a substrate. The IC also comprises a MOL layer disposed above the substrate. The IC further comprises a metal interconnect layer disposed over the MOL layer, the metal interconnect layer comprising a first metal conductive element and a second metal conductive element. The IC also comprises an elongated via disposed between the metal interconnect layer and the MOL layer, the elongated via disposed in contact with the first metal conductive element and the second metal conductive element to interconnect the first metal conductive element and the second metal conductive element.

In another aspect, an IC is disclosed. The IC comprises a substrate. The IC also comprises a MOL layer disposed above the substrate. The IC further comprises a means for providing a metal interconnect disposed over the MOL layer, the means for providing the metal interconnect comprising a metal interconnect layer means comprising a first metal conductive means and a second metal conductive means. The IC also comprises a means for coupling the metal interconnect layer means and the MOL layer, the means for coupling positioned above the MOL layer and beneath the metal interconnect layer means.

In another aspect, a method of forming an IC is disclosed. The method comprises, as part of a front-end-of-line (FEOL) process, providing a substrate. The method also comprises, as part of the FEOL process, providing a MOL layer disposed above the substrate. The method further comprises, as part of a MOL process, providing a metal interconnect layer disposed over the MOL layer, the metal interconnect layer comprising a first metal conductive element and a second metal conductive element. The method also comprises, as part of the MOL process, providing an elongated via disposed between the metal interconnect layer and the MOL layer in contact with the first metal conductive element and the second metal conductive element to interconnect the first metal conductive element and the second metal conductive element.

BRIEF DESCRIPTION OF THE FIGURES

FIG. 5 is a top plan view of the metal lines in a metal layer in the 3DIC of FIG. 4 coupled with an elongated via removed from the 3DIC of FIG. 4;

FIG. 6 is a partial, more detailed cross-sectional view of the coupled metal lines in the metal layer of the 3DIC in FIG. 4;

DETAILED DESCRIPTION

Figure 1:
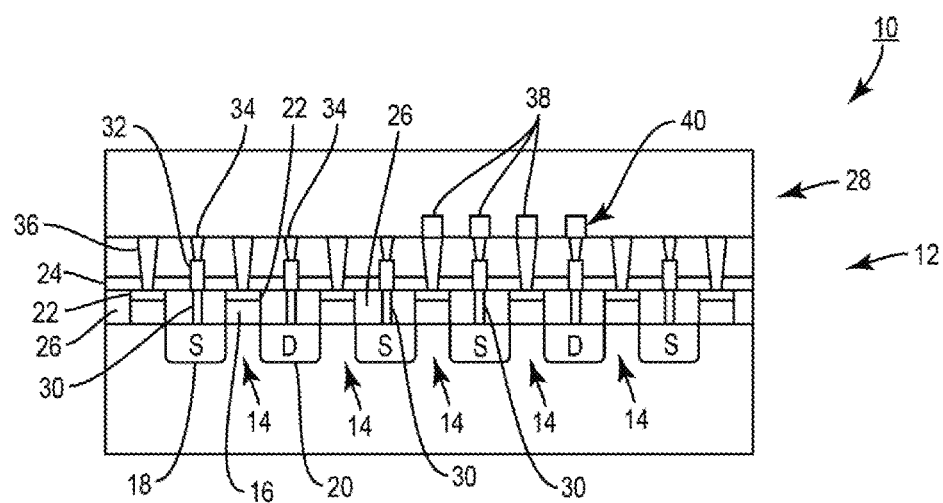
FIG. 1 is a simplified cross-sectional view of a conventional three-dimensional (3D) integrated circuit (IC) (3DIC) with metal layers in an upper tier.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include middle-of-line (MOL) manufactured integrated circuits (ICs) employing local interconnects of metal lines using an elongated via. Related methods are also disclosed. In particular, different metal lines in a metal layer may need to be electrically interconnected during a MOL process for an IC. In this regard, to allow for metal lines to be interconnected without providing such interconnections above the metal lines that may be difficult to provide in a printing process for example, in an exemplary aspect, an elongated or expanded via(s) is provided in a MOL layer in an IC. The elongated via is provided in the MOL layer below the metal layer in the MOL layer and extended across two or more adjacent metal layers in the metal layer of the MOL layer. Since such metal lines are typically fabricated in a metal layer unidirectional and parallel to each other, having such electrical cross-coupling allows for greater design flexibility in routing connective elements in MOL layers in an IC. Moving the interconnections to the MOL layer (e.g., above a dielectric layer) can simplify the manufacturing of integrated circuits (ICs), particularly at low nanometer (nm) node sizes.

Figure 2:
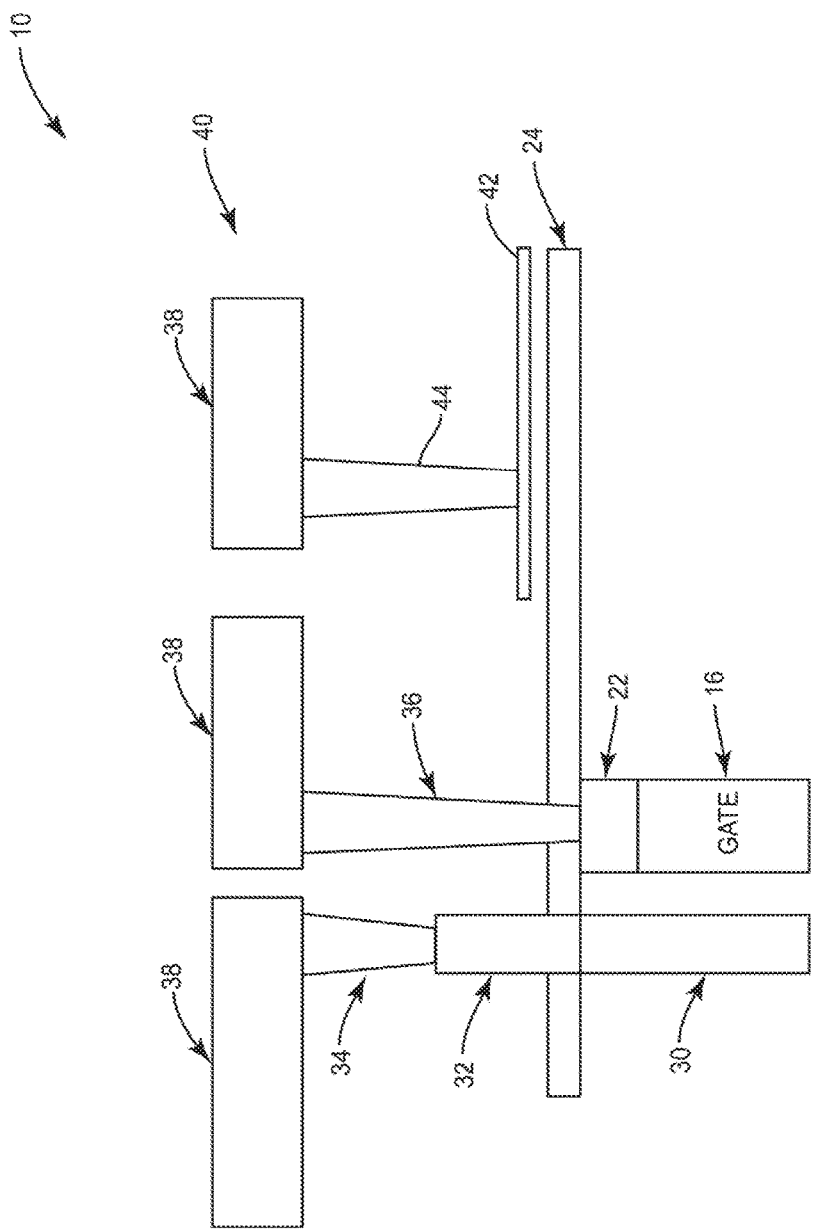
FIG. 2 is a partial, more detailed view of the cross-sectional view of the 3DIC of FIG. 1.
Figure 3:
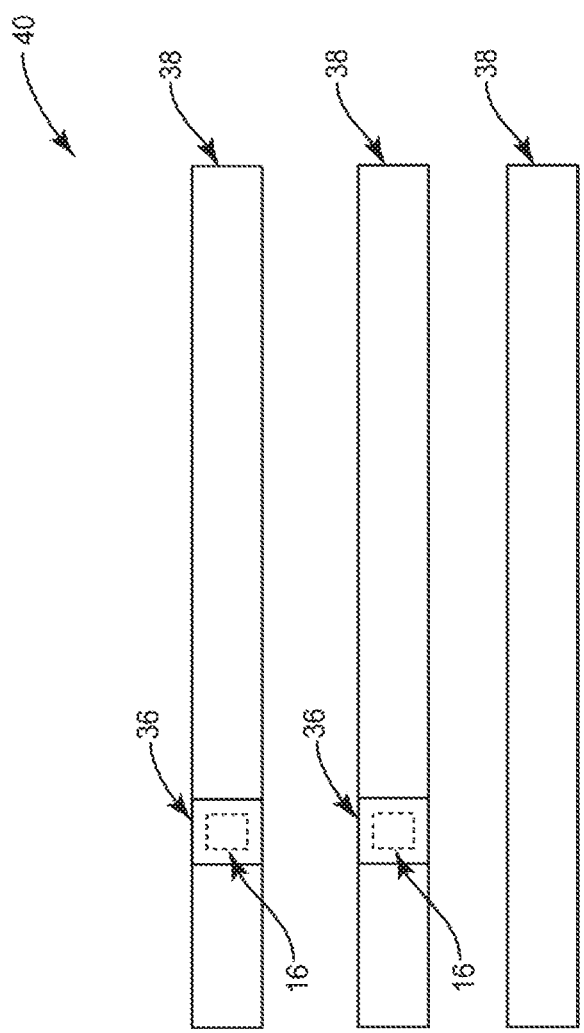
FIG. 3 is a top plan view of the metal layers removed from the 3DIC of FIGS. 1 and 2.

Before addressing exemplary aspects of an IC having a MOL layer employing local interconnect of metal lines disposed above the MOL layer using elongated vias of the present disclosure, a detailed discussion of the shortcomings of conventional processes for providing interconnections to metal lines in an IC is provided with reference to FIGS. 1-3. A discussion of exemplary aspects of the present disclosure begins below with reference to FIG. 4.

In this regard, FIG. 1 is a conventional three-dimensional (3D) IC (3DIC) 10 with a first tier 12 of active components, which in an exemplary aspect, may be transistors 14 with gates 16, sources (S) 18, and drains (D) 20. A metal gate connection 22 may overlie each gate 16 or at least a portion of each gate 16 (e.g., a gate region). A dielectric layer 24 is positioned over the metal gate connection 22. The dielectric layer 24 may be formed from a material such as Silicon Nitride (SiN). An interlayer dielectric 26 that is distinct from and different than the dielectric layer 24 may fill the space around the gates 16 and prevent shorting between elements. In an exemplary aspect, the interlayer dielectric 26 is a silicon oxide material. Alternatively, the interlayer dielectric 26 may be a low-K dielectric or other like material.

With continued reference to FIG. 1, the 3DIC 10 may include a second tier 28 with additional active elements (not illustrated). The second tier 28 may be positioned above the dielectric layer 24. Interconnections between first tier 12 and the second tier 28 may be effected by a combination of metal layers and vias. In an exemplary aspect, a first metal layer 30 is positioned beneath the dielectric layer 24 and extends up from a source 18 (or a drain 20) to the dielectric layer 24. A second metal layer 32 extends through the dielectric layer 24 and is electrically coupled to the first metal layer 30. Vias 34 couple to the second metal layer 32. Likewise, vias 36 may extend through the dielectric layer 24 to the metal gate connection 22 to couple to the gates 16. The vias 34 and 36 may couple to active elements in the second tier 28 or may couple to conductive elements 38 within a metal interconnect layer 40 within the second tier 28. In practice, the conductive elements 38 within the metal interconnect layer 40 are generally parallel and extend in a single direction, such that interconnections between the conductive elements 38 are not naturally present. As the node size of ICs, such as the 3DIC 10, decreases, the pitch of the conductive elements 38 decreases, and it becomes increasingly difficult to arrange interconnections between the conductive elements 38. Allowing such interconnections increases design flexibility, which in turn increases the versatility of the ICs.

Similar but different views of the conductive elements 38 of FIG. 1 are provided in FIGS. 2 and 3. In particular, the vias 34 and 36 are more readily visible above the dielectric layer 24 in FIG. 2, and the parallel, unidirectional nature of the conductive elements 38 is best illustrated in FIG. 3. FIG. 2 also illustrates a high accuracy resistor 42, which may serve as a dummy landing pad for a via 44.

To allow designers greater flexibility in making connections between elements, exemplary aspects of the present disclosure provide for techniques through which conductive elements of a metal interconnect layer may be interconnected during a MOL process. Providing such interconnections during a MOL process allows a tight pitch to be maintained between the conductive elements of a metal interconnect layer. Tighter pitch means that the design will be compact and save chip area. Further cost savings may be effectuated by eliminating the need to connect neighboring lines of the metal interconnect layer above the metal layer of a lower tier.

Figure 4:
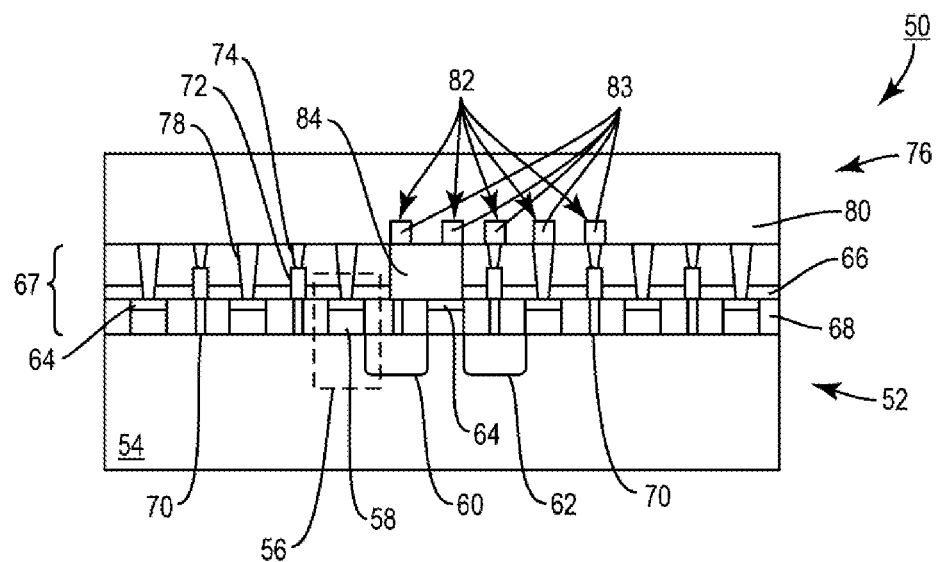
FIG. 4 is a cross-sectional view of a 3DIC having a middle-of-line (MOL) layer employing local interconnect of metal lines disposed above the MOL layer using elongated vias according to an exemplary aspect of the present disclosure.

In this regard, FIG. 4 illustrates a 3DIC 50 that includes a first tier 52 having a substrate 54 on which active elements 56 are formed. An exemplary active element 56 may be a transistor, which may include a gate 58, a source 60, and a drain 62. The gate 58 is covered with a metal gate connection 64, and the metal gate connection 64 is covered with a dielectric layer 66 in a MOL layer 67 (which may be SiN, and may be returned to as a MOL layer). An interlayer dielectric 68 may fill in around the gate 58 and provide insulation therefor. A first metal layer 70 and a second metal layer 72 may help provide electrical connections to the sources 60 and/or the drains 62, as needed or desired. Further, vias 74 may couple to the second metal layer 72 to provide connections to active elements (not shown) in a second tier 76. The vias 74 may be tungsten process vias as a non-limiting example. The vias 74 may also be through-silicon-vias (TSVs) as another non-limiting example. Other vias 78 may provide connections from the metal gate connection 64 to active elements in the second tier 76. In addition to any active elements within the second tier 76, the second tier 76 may also include a metal interconnect layer 80 with conductive elements 82 therein. It should be appreciated that instead of connecting directly to an active element, one or more vias 74, 78 may couple to the conductive elements 82 within the metal interconnect layer 80.

Exemplary aspects of the present disclosure expanding or elongating a via 84 disposed in the MOL layer 67 during a MOL process for the 3DIC 50. The elongated via 84 may couple two (or more) conductive elements 82, which are metal lines 83 in this example, within the metal interconnect layer 80 so as to create electrical connections without needing to change the pitch of the conductive elements 82 or otherwise complicate the manufacturing process. The elongated via 84 is provided between the MOL layer 67 and the metal interconnect layer 80 to provide interconnections between the conductive elements 82. By "elongated," it is meant that the via 84 is expanded or elongated in the MOL layer 67 such that it can span between two conductive elements 82, such as metal lines, in an IC to provide an interconnection between the conductive elements 82. For example, the metal lines may be adjacent to each other in the IC, as shown in the metal lines 83 in the 3DIC 50 in FIG. 4. Since such metal lines are typically fabricated in a metal layer unidirectional and parallel to each other, having such electrical cross-coupling allows for greater design flexibility in routing connective elements in MOL layers in an IC. Moving the interconnections to the MOL layer 67 (e.g., above the dielectric layer 66) can simplify the manufacturing of ICs, particularly at low nanometer (nm) node sizes. While the conductive elements 82 are shown as being parallel to the gate 58, it should be appreciated that in many chip fabrication processes, the conductive elements 82 are perpendicular to the gate 58.

The elongated via 84 may be a tungsten process via as a non-limiting example. The elongated via 84 may also be a through-silicon-via (TSV) as another non-limiting example. If the conductive elements 82 are perpendicular to the gate 58, the elongated via 84 may run parallel to the gate 58 and may use either a dummy second metal layer 72 or a dummy pad (e.g., like the high accuracy resistor 42, not shown in FIG. 4) as a landing pad.

As better illustrated in FIGS. 5 and 6, the expanded via 84 may span across two parallel conductive elements 82, such as the metal lines 83, to make the electrical connection. As better illustrated in FIG. 6, a dummy element 86 (also referred to as an insulator) may be provided that has a relatively high accuracy (e.g., TiN) to help isolate the expanded via 84 from the gate 58 or other active elements 56 below the expanded via 84. While it is particularly contemplated that the expanded via 84 may make the connection, it should be appreciated that other metal structures may also make the connection. Further, as used herein, a "means for coupling" is defined to include the expanded via 84 and such other metal structures.

Figure 7:
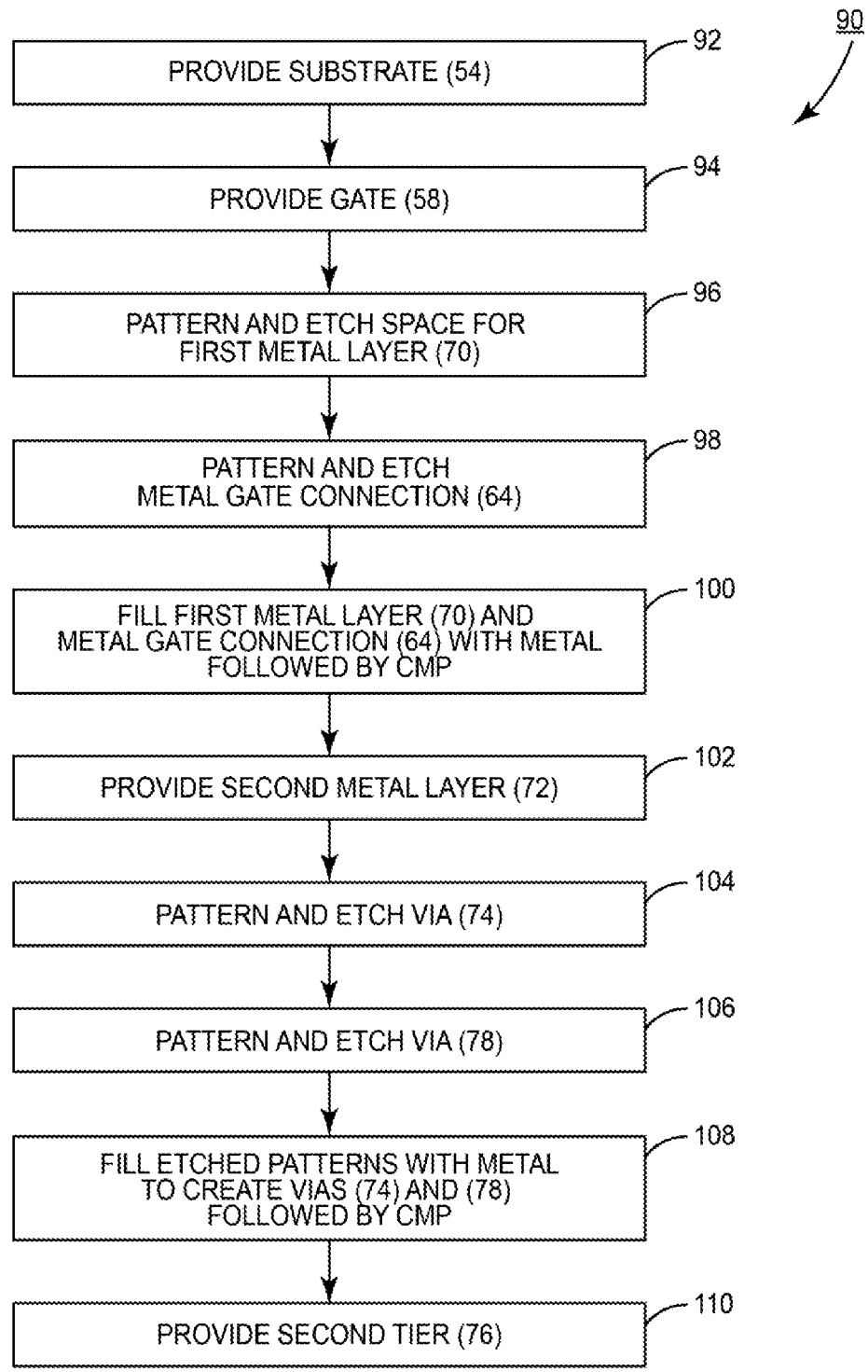
FIG. 7 is a flow chart of an exemplary manufacturing process used to make the 3DIC of FIG. 4 having a MOL layer employing local interconnect of metal lines disposed above the MOL layer using elongated vias.

FIG. 7 illustrates an exemplary process 90 to create the 3DIC 50 of FIG. 4 (or other IC) according to aspects of the present disclosure. The process 90 begins by providing a substrate 54 (block 92) and providing a gate 58 on the substrate 54 (block 94). A first metal layer 70 may be created by initially patterning and etching space for the first metal layer 70 (block 96) and patterning and etching space for a metal gate connection 64 (block 98). The etched pattern is then filled with metal to create the first metal layer 70 and the metal gate connection 64 followed by chemical mechanical polishing (CMP) (block 100).

With continued reference to FIG. 7, the process 90 continues by providing a second metal layer 72 (block 102) and then patterning and etching to provide space for vias 74 (block 104) and patterning and etching to provide vias 78 (block 106). The etched patterns are then filled with metal to create the vias 74, 78, followed by CMP (block 108). The second tier 76 may then be provided (block 110).

While discussed as being applicable for an IC and specifically for a 3DIC, it should be appreciated that aspects of present disclosure may also be used in other semiconductor devices.

The 3DIC 50 of FIG. 4 made according to the MOL manufacturing techniques for metal layers according to aspects disclosed herein, may be provided in or integrated into any processor-based device. Examples, without limitation, include: a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 8:
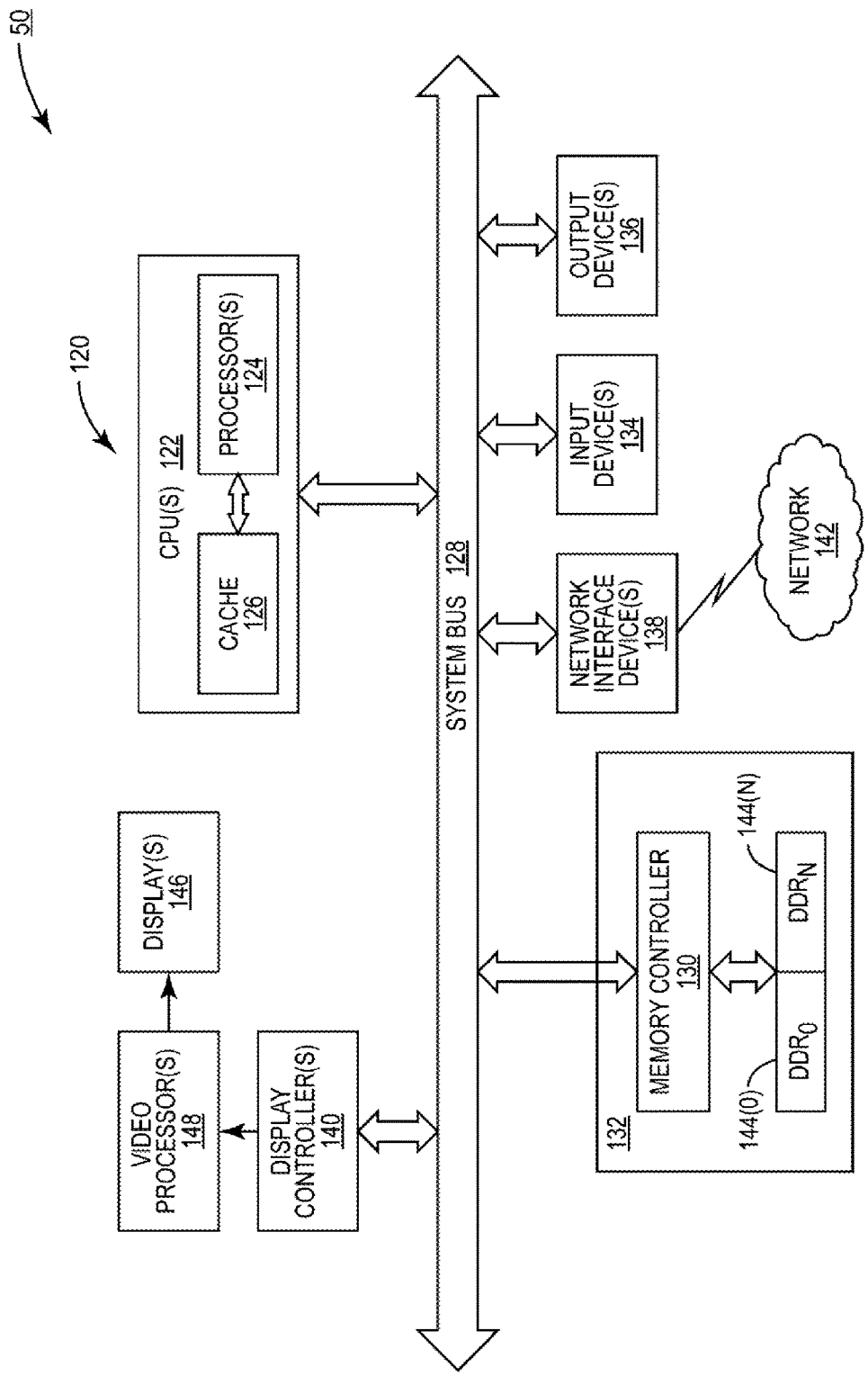
FIG. 8 is a block diagram of an exemplary processor-based system that can include the 3DIC of FIG. 4.

In this regard, FIG. 8 illustrates an example of a processor-based system 120 that can employ the 3DIC 50 illustrated in FIG. 4. In this example, the processor-based system 120 includes one or more central processing units (CPUs) 122, each including one or more processors 124. The CPU(s) 122 may have cache memory 126 coupled to the processor(s) 124 for rapid access to temporarily stored data. The CPU(s) 122 is coupled to a system bus 128 and can intercouple devices included in the processor-based system 120. As is well known, the CPU(s) 122 communicates with these other devices by exchanging address, control, and data information over the system bus 128. For example, the CPU(s) 122 can communicate bus transaction requests to a memory controller 130. Although not illustrated in FIG. 8, multiple system buses 128 could be provided.

Other devices can be connected to the system bus 128. As illustrated in FIG. 8, these devices can include a memory system 132, one or more input devices 134, one or more output devices 136, one or more network interface devices 138, and one or more display controllers 140, as examples. The input device(s) 134 can include any type of input device, including but not limited to, input keys, switches, voice processors, etc. The output device(s) 136 can include any type of output device, including but not limited to, audio, video, other visual indicators, etc. The network interface device(s) 138 can be any devices configured to allow exchange of data to and from a network 142. The network 142 can be any type of network, including but not limited to, a wired or wireless network, a private or public network, a local area network (LAN), a wide area network (WAN), a wireless LAN (WLAN), and the Internet. The network interface device(s) 138 can be configured to support any type of communications protocol desired. The memory system 132 can include one or more memory units 144(0-N).

The CPU(s) 122 may also be configured to access the display controller(s) 140 over the system bus 128 to control information sent to one or more displays 146. The display controller(s) 140 sends information to the display(s) 146 to be displayed via one or more video processors 148, which process the information to be displayed into a format suitable for the display(s) 146. The display(s) 146 can include any type of display, including but not limited to a cathode ray tube (CRT), a liquid crystal display (LCD), a light emitting diode (LED) display, a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system.

Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An integrated circuit (IC) comprising:
a semiconductor substrate comprising active elements;
a middle-of-line (MOL) layer disposed above the semiconductor substrate;
a metal interconnect layer disposed over the MOL layer, the metal interconnect layer comprising a first metal conductive element and a second metal conductive element; and
an elongated via disposed between the metal interconnect layer and the MOL layer, the elongated via disposed in contact with the first metal conductive element and the second metal conductive element to interconnect the first metal conductive element and the second metal conductive element.

2. The IC of claim 1, further comprising an interlayer dielectric positioned between the semiconductor substrate and the MOL layer, the interlayer dielectric different than and distinct from the MOL layer.

3. The IC of claim 1, wherein the MOL layer comprises a dielectric layer.

4. The IC of claim 1, wherein the first metal conductive element is comprised of a first metal line and the second metal conductive element is comprised of a second metal line.

5. The IC of claim 1, wherein the first metal conductive element is substantially parallel to the second metal conductive element.

6. The IC of claim 1, further comprising an insulator positioned below a metal structure, the insulator isolating the metal structure from the active elements associated with the semiconductor substrate.

7. The IC of claim 1, wherein the semiconductor substrate, the MOL layer, the metal interconnect layer, and the elongated via form a three-dimensional (3D) IC (3DIC).

8. The IC of claim 3, wherein the dielectric layer comprises Silicon Nitride (SiN).

9. The IC of claim 1, wherein the elongated via comprises a tungsten process via.

10. The IC of claim 1, wherein the elongated via comprises an elongated through-silicon-via (TSV).

11. The IC of claim 1, wherein the semiconductor substrate, the MOL layer, the metal interconnect layer, and the elongated via are integrated into a semiconductor die.

12. The IC of claim 1, wherein the semiconductor substrate, the MOL layer, the metal interconnect layer, and the elongated via are integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

13. An integrated circuit (IC) comprising:
a semiconductor substrate having active elements;
a middle-of-line (MOL) layer disposed above the semiconductor substrate;
a means for providing a metal interconnect disposed over the MOL layer, the means for providing the metal interconnect comprising a metal interconnect layer means comprising a first metal conductive means and a second metal conductive means; and a means for coupling the metal interconnect layer means and the MOL layer, the means for coupling positioned above the MOL layer and beneath the metal interconnect layer means.

14. A method of forming an integrated circuit (IC), comprising:
   as part of a front-end-of-line (FEOL) process, providing a semiconductor substrate having active elements;
   as part of the FEOL process, providing a middle-of-line (MOL) layer disposed above the semiconductor substrate;
   as part of a MOL process, providing a metal interconnect layer disposed over the MOL layer, the metal interconnect layer comprising a first metal conductive element and a second metal conductive element; and
   as part of the MOL process, providing an elongated via disposed between the metal interconnect layer and the MOL layer in contact with the first metal conductive element and the second metal conductive element to interconnect the first metal conductive element and the second metal conductive element.

15. The method of claim 14, further comprising providing an interlayer dielectric distinct from and different than the MOL layer, the interlayer dielectric positioned beneath the MOL layer.

16. The method of claim 14, wherein at least one active element of the active elements comprises a transistor.

17. The method of claim 14, wherein providing the MOL layer comprises providing a dielectric layer.

18. The method of claim 14, wherein providing the MOL layer comprises providing a Silicon Nitride (SiN) layer.

* * * * *